United States Patent [19]
Takahashi et al.

[11] 3,983,500
[45] Sept. 28, 1976

[54] ANGLE MODULATED WAVE DEMODULATION SYSTEM

[75] Inventors: Nobuaki Takahashi, Yamato; Kazunori Nishikawa, Fujisawa; Yoshiki Iwasaki, Yokohama; Masaaki Satoh, Yokohama; Katsuhiro Ohba, Yokohama; Shinji Nakamura, Minami-ashigara; Tatsuo Sawada, Sagamihara; Nobuhide Ohsaki, Yokohama; Yasuo Itoh, Tokyo; Nobuaki Suda, Yamato; Yasuhisa Okabe, Zama; Hideaki Ozaki, Sagamihara, all of Japan

[73] Assignee: Victor Company of Japan, Limited, Yokohama, Japan

[22] Filed: Sept. 3, 1974

[21] Appl. No.: 502,531

Related U.S. Application Data
[63] Continuation of Ser. No. 294,371, Oct. 2, 1972, abandoned.

[30] Foreign Application Priority Data

| Oct. 5, 1971 | Japan | 46-77531 |
| Feb. 16, 1972 | Japan | 47-16186 |
| Feb. 23, 1972 | Japan | 47-18109 |
| Mar. 3, 1972 | Japan | 47-22098 |
| Apr. 6, 1972 | Japan | 47-33842 |
| Apr. 22, 1972 | Japan | 47-40677 |
| May 24, 1972 | Japan | 47-51495 |

[52] U.S. Cl. .................... 329/122; 179/100.4 ST; 179/100.1 TD; 179/1 GQ
[51] Int. Cl.$^2$ .................. G11B 3/04; G11B 3/74; H03D 3/00
[58] Field of Search .................. 325/419, 421, 346; 329/122, 123, 124; 331/23, 25; 179/100.1 TD, 100.4 ST, 1 GQ, 1.5 BT

[56] References Cited
UNITED STATES PATENTS

| 3,209,271 | 9/1965 | Smith | 329/122 |
| 3,371,281 | 2/1968 | Powell | 325/346 |
| 3,654,564 | 4/1972 | Tisi | 329/122 |
| 3,686,471 | 8/1972 | Takahashi | 179/100.4 ST |

OTHER PUBLICATIONS

"Frequency-Selective Integrated Circuits Using Phase-Lock Techniques," by Grebene and Lamenzind, IEEE Journal of Solid State Circuits, Aug. 1969, pp. 216-225.

Pulse, Digital and Switching Wave Forms, by Millman and Taub, p. 193, 1965.

Circuits, Devices and Systems, by R. Smith, p. 143, 1966.

*Primary Examiner*—Bernard Konick
*Assistant Examiner*—Alan Faber

[57] ABSTRACT

An angle modulated wave demodulation system demodulates an input angle modulated wave by means of a phase locked loop system which comprises a phase comparator, which is operated responsive to an input angle modulated wave. A voltage controlled oscillator is supplied with a part of the output of the phase comparator which controls its oscillation frequency. The oscillator supplies its oscillation frequency to the phase comparator. The phase locked loop system has a lock frequency range which decreases its width when the level of the input angle modulated wave is below a predetermined level. The portion of this lock range in which the width of the lock range decreases is positively utilized. The voltage controlled oscillator oscillates at a frequency equal to the center frequency of the carrier of the input angle modulated wave, when the phase locked loop becomes unlocked.

4 Claims, 18 Drawing Figures

ANGLE MODULATED WAVE DEMODULATION SYSTEM

This is a continuation of application Ser. No. 294,371, filed Oct. 2, 1972, now abandoned.

BACKGROUND OF THE INVENTION

This invention relates to an angle modulated wave demodulation system and, more particularly, to a system for demodulating an angle modulated wave signal picked up from a multi-channel record disc.

The applicants of the present invention have heretofore proposed a recording and reproducing system for a four channel record disc (multi-channel record disc) in the U.S. patent application Ser. No. 92,803 filed on Nov. 25, 1970 and now patented under U.S. Pat. No. 3,686,471, entitled "SYSTEM FOR RECORDING AND/OR REPRODUCING FOUR CHANNEL SIGNALS ON A RECORD DISC". By this proposed system, in the recording system, sum and difference signals are formed respectively from signals of every two channels of the signals of four channels. More specifically, from signals respectively designated by the notations Ch1, Ch2, Ch3, and Ch4 representing the first through fourth channels, sum signals (Ch1 + Ch2) and (Ch3 + Ch4) and difference signals (Ch1 − Ch2) and (Ch3 − Ch4) are formed. Thereafter, the difference signals are angle modulated, and the angle-modulated wave difference signals F(Ch1 − Ch2) and F(Ch3 − Ch4) are of a band which is higher than the above mentioned direct-wave sum signals. These signals are mixed with the direct-wave sum signals (Ch1 + Ch2) and (Ch3 + Ch4).

The two multiplexed signals {(Ch1 + Ch2) + F(Ch1 − Ch2)} and {(Ch3 + Ch4) + F(Ch3 − Ch4)} of the direct-wave sum signals and the angle-modulated wave difference signals are recorded by cutting them on the left and right walls, respectively, of a groove of the 45 − 45 system on a record disc.

In the reproducing system, the reproduced multiplexing signals are respectively separated into direct-wave sum signals and angle-modulated wave difference signals. The latter signals are demodulated, and the original difference signals are again obtained. The sum signal (Ch1 + Ch2), difference signal (Ch1 − Ch2), sum signal (Ch3 + Ch4), and difference signal (Ch3 − Ch4) obtained in this manner are respectively matrixed. Thus, the original signals Ch1, Ch2, Ch3, and Ch4 of the four individual channels are again obtained. These signals are reproduced audibly from four loudspeakers disposed respectively at left front, left rear, right front, and right rear positions relative to a listener.

In some cases, an absence of a signal or an abrupt decrease in the signal level occurs in a signal picked up by a pick-up stylus. This occurs, for example, when a pick-up stylus rides over a particle of dust in a groove of a record disc and fails to faithfully and completely trace along the walls of the groove. Also, when a part of the groove is damaged, a part of the wave form on the groove is lacking. Sometimes, the waveform on the groove is so fine and complicated that the pick-up stylus jumps over it and fails to completely trace the waveform. Sometimes, a part of the groove has been worn away due to repeated reproductions of the record disc by using a pick-up cartridge having a stylus tip of a large equivalent mass, i.e. a large moment of inertia.

As stated above, the frequency range of the angle modulated difference signal (20KHz to 40KHz) recorded in the signal groove is higher than the range of the direct wave sum signal. Accordingly, a part of the waveform having a relatively gradual curve relates to the direct wave sum signal and a part having a relatively small and fine waveform relates to the angle modulated wave difference signal. Therefore, the absence of signal and the drop in the level in the reproduced signal in each of the above described cases occurs particularly in the angle modulated wave difference signal.

In the portion of the recording where the absence of signal and the drop in the level occurs, the frequency of the carrier component in the angle modulated wave difference signal has abruptly deviated to substantially a very low frequency. Accordingly, noise is generated in an angle demodulator in a later stage in the portion where the carrier wave has thus abruptly deviated to a low frequency.

The abrupt decrease in the angle modulated wave and the resulting generation of noise is characteristic of a reproduction of the multi-channel record disc and is essentially different from a noise generation which generally occurs in FM communication etc. In FM communication, the carrier is always maintained at a constant level. If a noise signal is added thereto, a result is that the level as a whole increases rather than decreases. Furthermore, a change in the level of an angle modulated wave observed in a fading phenomenon is gradual and not abrupt. Whereas in the multi-channel record disc, it is inevitable that the level of the angle modulated wave decreases abruptly due to the relationship between the tip of the stylus and the groove, existence of dust, damage of the groove and other causes.

In order to prevent the reproduction of the abnormal noise as described above, the applicant previously proposed a muting system in which the absence of the signal in the angle modulated wave is detected and the difference signal system is thereby switched OFF. According to that proposed system, however, the muting circuit frequently switches between ON and OFF as the disc is reproduced if, for example, the sound groove is half damaged. In this case, the reproduced sound field is frequently switched between the two channels and four channels so that orientation of the sound field changes thereby producing an undesirable accoustic effect.

On the other hand, a method may be conceivable in which the sound volume of the difference signal is continuously changed according to the level of the angle modulated wave, depending upon damage of the sound groove. This method, however, is disadvantageous since the separation of the signals is poor because the level of the sum signal does not change in accordance with the damage of the sound groove. Alternatively, a system is conceivable in which the frequency characteristic of the difference signal is changed in accordance with the change in the level of the angle modulated wave. This system is also disadvantageous in that the phase characteristic in the middle frequency band changes although the frequency characteristic in middle frequency band does not change in response to the change in frequency characteristic in high frequency band. As a result, the separation characteristic of the middle frequency band, as well as of high frequency band, is deteriorated. Therefore, none of the above described methods are effective to eliminate the noise accompanying the absence of signal and the abrupt drop in the level in the angle modulated wave, and none are suitable for practical use.

SUMMARY OF THE INVENTION

It is, therefore, a general object of the present invention to provide a novel and useful demodulation system for an angle modulated wave, which system has overcome the above described disadvantages and problems.

Another object of the invention is to provide a demodulation system which is capable of demodulating an angle modulated wave without producing the abnormal noise even when the absence of signal and the abrupt drop in the level occur in the angle modulated wave. The system according to the invention is particularly effective when adapted for a reproduction and demodulation system for a multi-channel record disc on which an angle modulated wave signal and a direct wave signal which are superposed one upon the other are recorded.

A further object of the invention is to provide an angle modulated wave demodulation system employing a novel phase locked loop. The system, according to the invention, positively employs a narrow portion of the width of the lock frequency range of the phase locked loop. When an input signal of a low level is outside of the lock range characteristic of the phase locked loop, a voltage controlled oscillator of the phase locked loop oscillates at a predetermined frequency.

A still further object of the invention is to provide an angle modulated wave demodulation system which is capable of effectively preventing noise generation due to an absence of a signal and a drop in the level of the angle modulated wave, and adverse effects due to deviations in the speed of rotation of the turntable which rotates the multi-channel record disc, variations in circuit operation due to variation of temperature and other causes. The phase locked loop in this demodulation system shows two different lock frequency ranges.

Other objects and features of the invention will become apparent from the description made hereinbelow in conjunction with the accompanying drawings in which:

DETAILED DESCRIPTION

Figure 1:
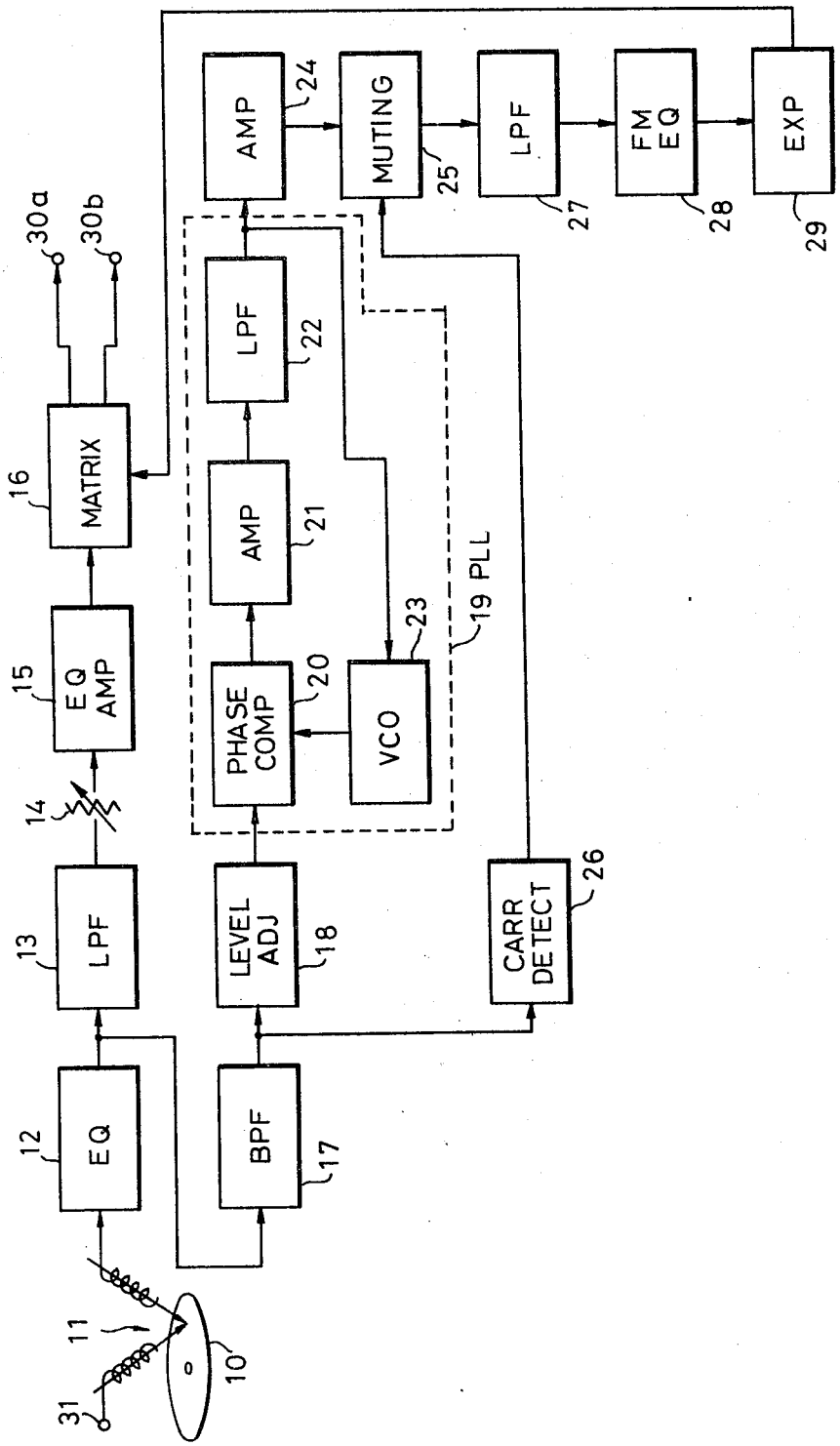
FIG. 1 is a block diagram showing a first embodiment of a four channel record disc reproduction system to which the angle modulated wave demodulation system according to the invention is applied.
Figure 2:
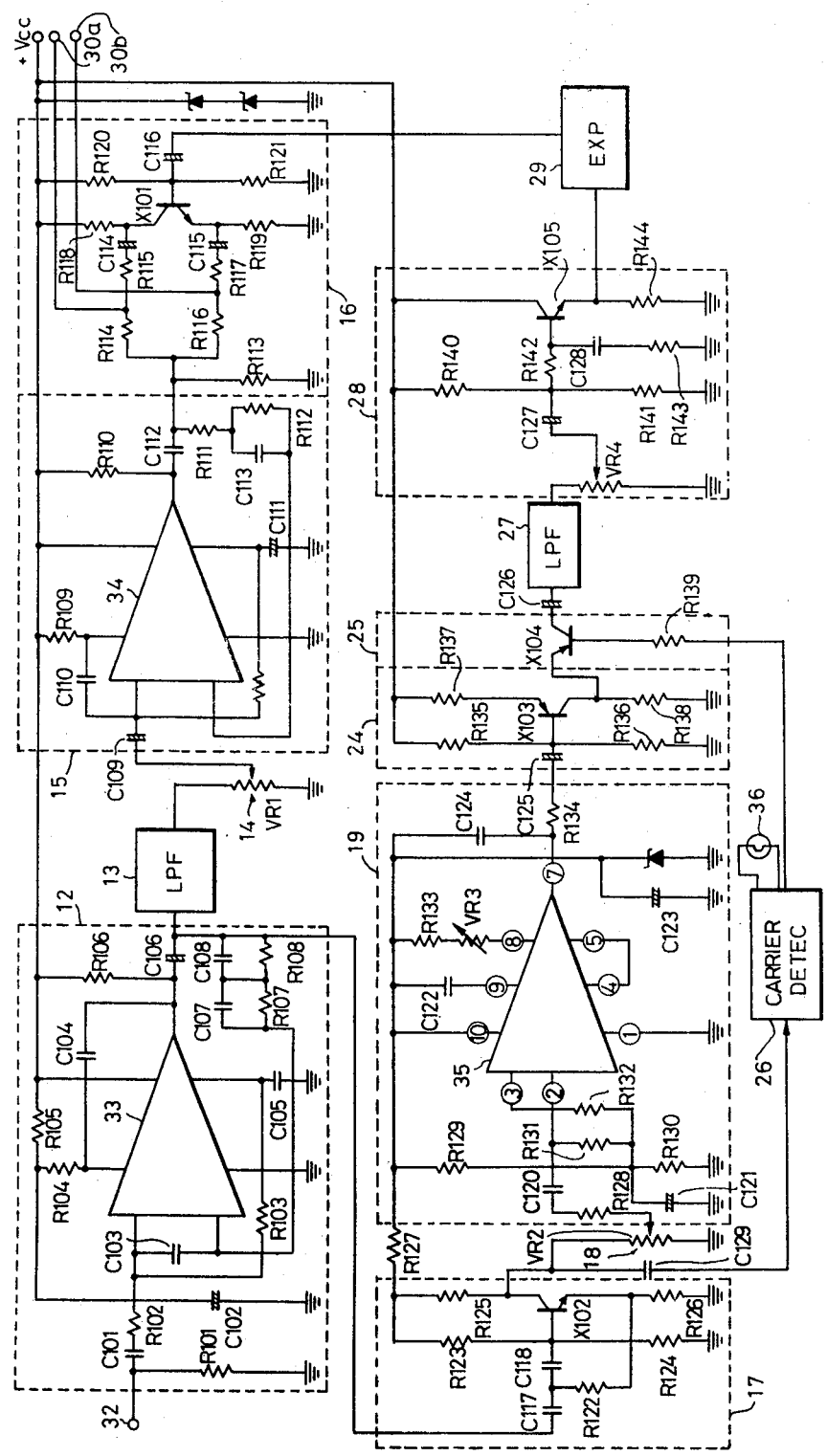
FIG. 2 is a circuit diagram of one embodiment of a concrete electrical circuit of the block system shown in FIG. 1.

First to be described are FIGS. 1 and 2, which show a first embodiment of the four channel record disc reproduction system to which the angle modulated wave demodulation system, according to the present invention, is applied.

In accordance with the recording system which the applicants proposed as described above, a four channel record disc 10 has a superposed signal of a direct wave sum signal and an angle modulated wave difference signal of two channel signals recorded on either wall of a sound groove, thereby providing four channel signals which are recorded on the two walls of the groove. Among the signals picked up by a pick-up cartridge 11, from the groove of the disc 10, is a superposed signal of a direct wave sum signal and an angle modulated wave difference signal recorded on the right wall of the groove. These two channels, reproduced from the right wall of the groove, are supplied to an equalizer 12 in which the direct wave sum signal is equalized according to the RIAA (Recording Industries Association of America) standards.

This reproduced signal is supplied, on the one hand, to a low-pass filter 13 in which the angle modulated wave component is removed. Only the direct wave sum signal component is taken out. This direct wave sum signal component is taken out. This direct wave sum signal component is supplied, through a variable resistor 14 for adjusting separation, to an equalizing amplifier 15 in which it is equalized and amplified. The sum signal component is thereafter supplied to a matrix circuit 16.

The output of the equalizer 12 is supplied, on the other hand, to a band-pass filter 17 having a filtering band of 20KHz to 40KHz, in which the angle modulated wave difference signal component is derived. This angle modulated wave component is adjusted to a predetermined level in a level adjusting circuit 18. Thereafter, it is supplied to a phase comparator 20 of a phase locked loop (hereinafter referred to as "PLL"), here shown by a surrounding broken line. The output angle modulated wave from the band-pass filter 17 is also supplied to a carrier detection circuit 26, which is provided for detecting whether the angle modulated wave exists or not. The output of the carrier detection circuit 26 is supplied to a muting circuit 25.

The PLL 19 is of a conventional construction including the phase comparator 20, an amplifier 21, a low-pass filter 22 and a voltage controlled oscillator 23. The phase comparator 20 compares the phase of the input angle modulated wave to be demodulated (which is supplied from the level adjusting circuit 18) with the phase of the output oscillated wave from the voltage controlled oscillator 23. Circuit 20 produces an error voltage which varies with the phase difference. The output error voltage is amplified in an amplifier 21. Thereafter, it is supplied through a low-pass filter 22 to an amplifier 24 and also to the voltage controlled oscillator 23, as a control voltage.

When no input signal is supplied from the level adjusting circuit 18 to the phase comparator 20 or when the PLL 19 is not in locked condition, the voltage controlled oscillator 23 oscillates at a frequency which is equal to the carrier frequency (30KHz in the present embodiment) at which the angle modulation is made in the recording system. The voltage controlled oscillator 23 is controlled in its oscillation frequency responsive to the control voltage from the low-pass filter. Its oscillating output frequency becomes equal to the frequency of the input angle modulated wave to the phase comparator 20. Accordingly, the voltage obtained from the low-pass filter 22 (i.e. the input voltage to the voltage controlled oscillator 23) is a voltage correspnding to the frequency deviation of the angle modulated wave supplied to the phase comparator 20. Therefore, a demodulated output of the angle modulated wave is obtained from the PLL 19.

The above described operation of the PLL 19 is a demodulating operation common to a conventional PLL. The feature of the system, according to the invention, resides in the manner in which the lock frequency range is used, as will be described later in detail.

The PLL 19 can operate as a PLL if the low-pass filter 22 is omitted. In this case, the PLL has an advantage that its speed of response increases. Further, in actually constructing the circuit, care must be taken so as to prevent a superposition of the DC wave signal component upon the low frequency signal component in the input angle modulated wave signal, since the phase comparison capacity of the phase comparator 20 decreases if a DC component is included in the input signal to the phase comparator 20.

The demodulated difference signal obtained from the PLL 19 is amplified in the amplifier 24 and thereafter is supplied to the muting circuit 25. The muting circuit 25 is controlled by the output of the carrier detection circuit 26 to switch ON when the angle modulated wave signal component is included in the reproduced signal from the disc 10 and switch OFF when it is not so included. Thus, the muting circuit 25 prevents a noise component from appearing in the output. It is to be noted that the carrier detection circuit 26 has a time constant which is large enough to cause the muting circuit 25 to effect muting so as to prevent an occurrence of noise when, for example, the playing back apparatus is not playing the disc. Accordingly, during playing back of the disc 10, the muting circuit 25 is not operated by the absence of signal or a drop in the signal level due to the damage of groove etc.

The output of the muting circuit 25 passes through a low-pass filter 27 in which the carrier component is removed. The signal then passes through an FM equalizer 28 and is expanded in an expandor 29. The expansion corresponds to a compression provided on the recording side, and is thereby adjusted in its frequency characteristic. Then the signal is supplied to the matrix circuit 16. The matrix circuit 16 matrixes the supplied sum signal and the difference signal and separately sends out a first channel signal and a second channel signal, to output terminals 30a and 30b.

In FIG. 1, only the circuit system for the first and second channels (the left channel system of the groove of the disc 10) is illustrated. It will be understood that a similar circuit system (not shown) is provided for the third and fourth channels. A signal obtained from a terminal 31 of the pickup 11 is supplied to this similar circuit system. The construction and the operation of this similar circuit system for the third and fourth channels are entirely the same as for the circuit system for the above described first and second channels, so that the illustration and description thereof are therefore omitted.

A circuit diagram of one embodiment of a concrete electrical circuit of the block diagram shown in FIG. 1 is illustrated in FIG. 2. In FIG. 2, a circuit portion corresponding to the portion in FIG. 1 is designated by the same block.

A reproduced signal from the pick-up cartridge 11 is supplied from an input terminal 32 to the equalizer 12 which impaerts only a crossover characteristic of the RIAA standards equalizing characteristic. the signal is thereafter amplified by an IC equalizing amplifier 33. The output signal of the equalizer 12 is supplied to a low-pass filter 13 in which the direct wave sum signal component is taken out. This direct wave sum signal is supplied through the separation adjusting circuit 14, comprising the variable resistor VR1 to the equalizing amplifier circuit 15, which comprises an IC equalizing amplifier 34 and gives a roll-off of part of the RIAA standards. Then the signal is supplied to the matrix circuit 16.

The output signal of the equalizer 12 is also supplied to the band-pass circuit 17, which comprises a band-pass amplifier including a transistor X102, and has a high-pass characteristic. In the band-pass circuit 17, the angle modulated wave difference signal component is taken out. This angle modulated wave is adjusted in its level by the level adjusting circuit 18 comprising a variable resistor VR2 in accordance with the reproduction capacity of the pick-up cartridge. The angle modulated wave, which has been adjusted in its level, is supplied to the PLL 19 including an IC PLL circuit 35 in which it is demodulated. The demodulated output of the PLL 19 is amplified at the amplifier 24, including a transistor X103. Thereafter, it is supplied to the muting circuit 25 comprising a gating transistor X104.

The signal obtained from the band-pass circuit 17 is also supplied to a carrier detection circuit 26 in which the carrier component is detected. This carrier detection circuit 26 comprises five switching transistors which make switching operations in such a manner that their rising time is long and falling time is short when the carrier is applied. When an ordinary stereo record disc is played, they do not follow an instantaneous signal equivalent to the carrier, which equivalent is produced due to a harmonics distortion characteristic of the pick-up cartridge. The carrier detection circuit 26 has a four channel indication lamp 36 connected thereto, which is lighted when the circuit 26 detects the carrier signal component. The carrier detection circuit 26 has only to be provided in either one of the left and right channel systems since detection of the carrier in either channel is the full equivalent of detection in both channels. The output of the carrier detection circuit 26 is applied to the base of the transistor X104 via a resistor R139. Thus, the detection circuit causes the transistor X104 to become conductive when there is the angle modulated wave component in the input signal.

The output difference signal of the muting circuit 25 is supplied to the matrix circuit 16 through the low-pass filter 27, the FM equalizer 28 including a transistor x105 and the expandor 29 and is matrixed with the above-mentioned sum signal.

Constants of respective circuit elements are as follows:

| Resistors | | | | | |
|---|---|---|---|---|---|
| R101 | 560 | KΩ | R123 | 330 | KΩ |
| R102 | 1 | '' | R124 | 22 | '' |
| R103 | 120 | '' | R125 | 4.7 | '' |
| R104 | 220 | '' | R126 | 180 | Ω |
| R105 | 100 | '' | R127 | 270 | '' |
| R106 | 15 | '' | R128 | 15 | KΩ |
| R107 | 68 | '' | R129 | 10 | '' |
| R108 | 10 | '' | R130 | 10 | '' |
| R109 | 330 | '' | R131 | 560 | Ω |
| R110 | 33 | '' | R132 | 560 | '' |
| R111 | 390 | Ω | R133 | 2.7 | KΩ |
| R112 | 6.8 | KΩ | R135 | 33 | '' |
| R113 | 150 | '' | R136 | 470 | '' |
| R114 | 10 | '' | R137 | 220 | Ω |
| R115 | 10 | '' | R138 | 4.7 | KΩ |
| R116 | 10 | '' | R139 | 18 | '' |
| R117 | 10 | '' | R140 | 270 | '' |
| R118 | 1 | '' | R141 | 56 | '' |
| R119 | 1 | '' | R142 | 47 | '' |
| R120 | 470 | '' | R143 | 4.7 | '' |
| R121 | 220 | '' | R144 | 4.7 | '' |
| R122 | 6.8 | '' | | | |

| Variable resistors | | | | | |
|---|---|---|---|---|---|
| VR1 | 10 | KΩ | VR3 | 2.2 | KΩ |
| VR2 | 50 | '' | VR4 | 5 | '' |

| Capacitors | | | | | |
|---|---|---|---|---|---|
| C101 | 2.2 | μF | C115 | 4.7 | μF |
| C102 | 47 | '' | C116 | 1 | '' |
| C103 | 330 | PF | C117 | 0.001 | F |
| C104 | 5 | '' | C118 | 0.001 | '' |
| C105 | 100 | μF | C119 | 0.015 | '' |
| C106 | 10 | '' | C120 | 0.0022 | '' |
| C107 | 0.033 | '' | C121 | 1 | μF |
| C108 | 47 | PF | C122 | 0.0027 | F |
| C109 | 0.22 | μF | C123 | 10 | μF |
| C110 | 47 | PF | C124 | 0.0027 | F |
| C111 | 33 | μF | C125 | 1 | μF |
| C112 | 3.3 | '' | C126 | 2.2 | '' |
| C113 | 0.01 | F | C127 | 4.7 | '' |
| C114 | 4.7 | μF | C128 | 0.0039 | F |

Next, the operation of the phase locked loop which constitutes the essential part of the system according to the invention will be described more in detail.

The general demodulating operation of the PLL 19 has been described above. Its particular operation in the first embodiment of the system of the invention will now be described.

Figure 3:
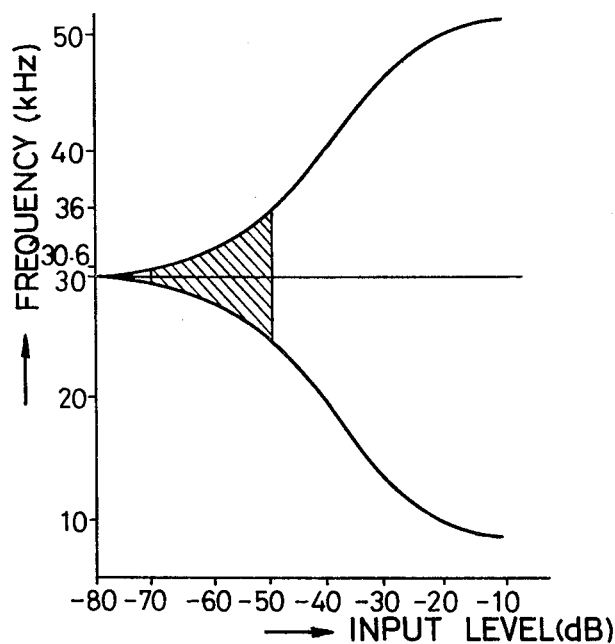
FIG. 3 is a diagram showing the lock frequency range of a phase locked loop which is capable of carrying out the first embodiment of the inventive system shown in FIG. 1.

In phase comparator 20, the maximum value of the output error voltage is determined by the level of the input angle modulated wave signal. The PLL 19 has, for example, a lock frequency range as shown in FIG. 3. In this figure, the level of the input angle modulated wave signal is plotted along the abscissa and the carrier frequency of the input angle modulated wave signal is plotted along the ordinate. The area between the two curves shows the lock frequency range within which the oscillation frequency of the voltage controlled oscillator 23 follows the carrier frequency of the input angle modulated wave. The oscillation frequency of the voltage controlled oscillator 23 cannot follow the carrier frequency at the outside of the area. Even if the phase difference between the input angle modulated wave signal to the phase comparator 20 and the output signal of the voltage controlled oscillator 23 remains the same, the level of the output signal of the phase comparator 20 varies with the level of the input signal when the level of the input angle modulated wave signal is low. When the level of the input angle modulated wave to the PLL 19 is low as shown in the figure, the width of the lock range becomes narrow, that is, the frequency difference between the two curves in FIG. 3 becomes smaller. Accordingly, the PLL 19 has a characteristic such that the width of the lock range is the widest when the level of the input angle modulated wave is above a predetermined level, and, below this predetermined level, the width of the lock range becomes narrower as the level decreases.

The reason for it will be described hereinbelow. The phase comparator generally has the following characteristics. Specifically, during periods when the level of the input angle modulated wave signal is low, the output error voltage of the phase comparator increases in accordance with an increase of the level of the input angle modulated wave signal even if the difference between the carrier frequency of the input angle modulated wave signal and the oscillation frequency of the voltage controlled oscillator is the same. When the level of this modulated signal increases to become more than a specific level, the operation of the phase comparator is gradually saturated and the output error voltage thereof approaches a specific value. When the level of the input angle modulated wave signal is small, as described above, the output error voltage of the phase comparator is small, as compared with the saturation value. The output error voltage, smaller than the saturation value, is applied to the voltage controlled oscillator as a control signal.

Since the oscillation frequency of the voltage controlled oscillator varies as a function of the level of the control signal, a small change occurs in the oscillation frequency in response to the control signal having a small level. Accordingly, in a state where there is specific difference in frequency between the carrier frequency of the input angle modulated wave and the oscillation frequency of the voltage controlled oscillator, the voltage controlled oscillator quickly changes the oscillation frequency thereof when a large control signal is applied thereto. The oscillation frequency changes gradually when the small control signal is applied thereto.

For this reason, if there is a large difference between the oscillation frequency of the voltage controlled oscillator and the carrier frequency of the input angle modulated wave, when the level of the control signal is zero, the oscillation frequency of the voltage controlled oscillator can follow the carrier frequency when the large control signal is being applied thereto. However, it cannot follow the carrier frequency when the small control signal is being applied thereto, causing it to assume an unlocked state. This means that the lock frequency range becomes a narrow one.

As the lock range becomes narrower, the error output signal of the phase comparator 20 decreases. Therefore, the speed of response to the input angle modulated wave signal becomes slower resulting in an attenuation in a high frequency demodulated signal. The speed of response can be increased by omitting the low-pass filter 22 (FIG. 1), as described above. Even if the low-pass filter 22 is omitted, the PLL can operate in a normal manner due to an existence of very small capacitance in the phase comparator 20, the amplifier 21 and the voltage controlled oscillator 23.

The PLL has heretofore been employed for various communication and broadcasting services by utilizing characteristic of the widest portion of the lock range. As previously described, the level of a carrier of a received signal in FM communication, FM broadcasting and the like is substantially constant. In case a noise such as that caused by atmospheric conditions is mixed in with the signal, the signal level always increases. Therefore, if the widest portion of the lock range is used when the level of the carrier of the reproduced signal has abruptly decreased in a reproduction apparatus for a multi-channel record disc, an abnormal noises occur as described above.

Therefore, in a system according to the invention, the narrow portion of the lock range (as shown by the shaded portion in FIG. 3) is positively used. In determining the portion of the lock range to be used, a level adjusting is made by the level adjustment circuit 18 so that the reference input level of the input angle modulated wave to the phase comparator 20 of the PLL 19 comes within the input level range corresponding to the shaded portion of the lock range.

The lock range as shown by the shaded portion is used when the angle modulated wave in the signal picked up from the record disc 10 has a normal level, the PLL 19 is locked by the angle modulated wave in a relatively portion of the lock range, the width of which is large. The PLL demodulates the signal in following up the change of frequency. When the level of the input angle modulated wave drops abruptly, the width of the lock range abruptly becomes narrow, and the PLL 19 becomes unlocked and ceases to make PLL operation. Thereupon the voltage controlled oscillator 23 oscillates at a frequency of 30KHz (equal to the center frequency of the carrier of the angle modulated wave). Accordingly, even if the level of the input angle modulated wave has abruptly decreased or disappears, the carrier is reinforced in this portion by the oscillation output of the unlocked voltage controlled oscillator 23 and, therefore, no abnormal noise occurs.

For determining the upper and lower limits of the input level corresponding to the shaded portion of the lock range shown in FIG. 3, the upper limit is selected, for example, in such a manner that when the level of the input angle modulated wave abruptly decreases the PLL can become unlocked and the voltage controlled oscillator 23 oscillates at the center frequency of the carrier of the angle modulated wave, whereas the lower limit is selected in such a manner that when the input angle modulated wave is at a normal level the PLL can stay in a locked state and maintain a normal dynamic range.

In particular, an inner peripheral portion on the record disc generates an abnormal noise during the playing back of a multi-channel record disc, and this noise creates a serious problem. Accordingly, the level adjustment is accomplished in the level adjusting circuit 18. The the level of the input angle modulated wave to the PLL 19 stays within the input level corresponding to the above-described shaded portion when a signal is picked up and demodulated by a pick-up cartridge in the inner peripheral portion of the multi-channel record disc. For example, at this portion a sound groove diameter of 150 mm and a speed of 33⅓ rpm under the condition that the carrier recording level is at a speed amplitude of 35.4 mm/sec.

The output level of the carrier band of the pick-up cartridge varies largely depending upon a type of the cartridge. For example, a cartridge for playing back a multi-channel record disc produces a carrier output of 2.5 mV, whereas a conventional two channel pick-up cartridge produces an output of only 100 μV. Primarily, the output level varies depending upon the types of the signal pick-up generation mechanism, such as an induced magnet type, a moving magnet type, a moving coil type and ceramic type. Accordingly, the level adjustment is made in the level adjusting circuit 18 according to the output level of the cartridge. If, however, the level is adjusted to the predetermined level without variation in the relation between the playing back apparatus and the pick-up cartridge, this level adjusting circuit 18 is not absolutely necessary.

In the system of the first embodiment, if a very narrow portion of the lock range is used, (i.e. if the level of the input angle modulated wave is low), there is a slight difference between the oscillation frequency of the voltage controlled oscillator and the frequency of the angle modulated wave from the pick-up. This difference tends to break the lock of the PLL 19, with a resulting generation of noise. More particularly, if the level of the input signal is low and has a frequency in the vicinity of the limit of synchronization (i.e. on either one of the curves in FIG. 3), the voltage controlled oscillator 23 irregularly repeats the oscillation frequency (30KHz) of a predetermined a frequency equal to that of the input signal frequency, in response to the level of the input signal. Accordingly, if the difference between the oscillation frequency of the voltage controlled oscillator 23 and the input signal frequency is 1,000Hz, a noise is generated having a frequency which is lower by 1,000Hz.

Further, the rotational speed of the turntable for the multi-channel record disc 10 has a deviation of about 3%. The voltage controlled oscillator 23 also has a deviation of about 3% in its oscillation frequency due to aging, change in temperature etc. Thus, the total error might amount to 6%. The 6% error relative to the frequency of 30KHz means an error of 1.8KHz. Consequently, the system of the first embodiment has a very undesirable problem in that a noise of 1.8KHz or lower is generated when the level of the input angle modulated wave has dropped to a very low level.

An embodiment in which the above described problem inherent in the first embodiment has been overcome will now be described.

Figure 4:
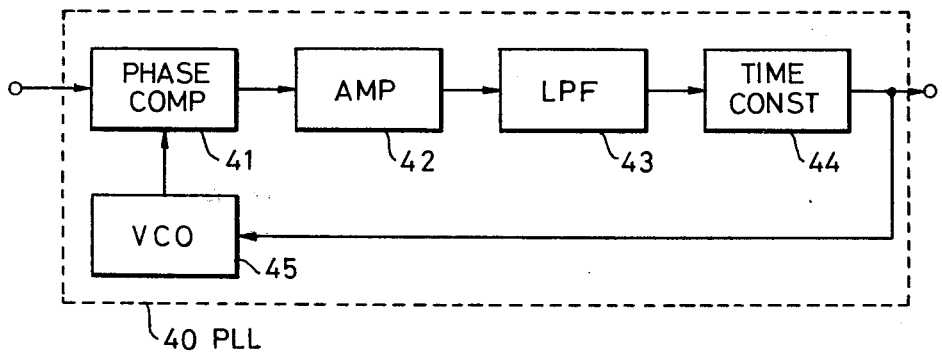
FIG. 4 is a block diagram of a phase locked loop which is capable of carrying out a second embodiment of the demodulation system according to the invention.

FIG. 4 is a block diagram of a phase locked loop which is capable of carrying out the demodulation system according to the invention. A phase locked loop (PLL) 40 in the present embodiment can take the place of the PLL 19 in the first embodiment. Phase comparator 41 produces a signal in response to a phase difference between the phase angle of the input angle modulated wave signal and the output oscillated signal of a voltage controlled oscillator 45 and a demodulated output in response to the level of the input angle modulated wave signal. An amplifier 42 makes a limiting amplification of the signal supplied from the phase comparator 41, saturating a signal above a predetermined level. If necessary, a low-pass filter 43 is inserted to stabilize the system of the loop.

In the present embodiment, a time constant circuit 44 is provided next to the low-pass filter 43. The output of the time constant circuit 44 is taken out as the output of the PLL 40, whereas a part of this output is applied to the voltage controlled oscillator 45 as a control voltage.

The lock frequency range of the PLL without the time constant circuit 44 is as shown in FIG. 3. For example, the lock range is 30KHz ± 6KHz when the input signal level is −50 dB and 30KHz ± 600Hz when the input signal level is −70, which is lower than the former by 20 dB.

Figure 5:
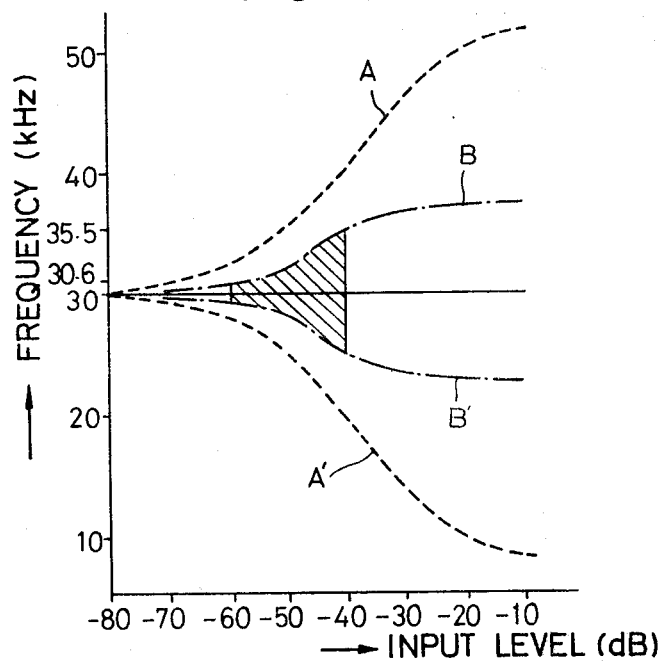
FIG. 5 is a diagram showing the lock frequency range of the phase locked loop shown in FIG. 4.

FIG. 5 shows one example of the lock frequency ranges of the PLL 40 in which the time constant circuit 44 is provided. If the frequency change of the carrier of the input angle modulated wave is very gradual, (i.e. a frequency deviation with period proximate to a direct current, e.g. 1Hz), the lock range is the range between two curves A and A' which is 30KHz ± 6KHz at the level of −50dB and 30KHz ± 600Hz at the level of −70dB, which is similar to the curves shown in FIG. 3. However, when the frequency deviation is one with a short period as in an audio frequency, the lock range is the range between two curves B, B' which is 30KHz ± 2KHz at the level of −50dB, and 30KHz ± 200Hz at the level of −70dB.

If the portion corresponding to the input level of −50dB to −70dB is utilized in the first embodiment as the lock range of the PLL, a portion corresponding to the input level of −40dB to −60dB (which is shown as the shaded portion in FIG. 5) is utilized in the present embodiment. In the portion where the input level is −40dB to −60dB, the lock range is 30KHz ± 5.5KHz to 30KHz ± 600Hz relative to the frequency deviation with a short period as in the audio frequency. However, the lock range is a relatively wide one of 30KHz ± 10KHz to 30KHz ± 2KHz with respect to the deviation in the speed of rotation of the turntable for the player, the deviation in the oscillation frequency of the voltage controlled oscillator 45, and the like.

Figure 6:
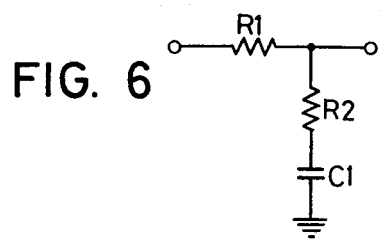
FIG. 6 is a circuit diagram of one embodiment of the time constant circuit included in the phase locked loop shown in FIG. 4.

Accordingly, the PLL 40 operates normally without becoming unlocked even if there is a very gradual deviation in the oscillation frequency of the voltage controlled oscillator 45 due to aging, change in temperature etc. Thus, there may be a difference, in the order of 2KHz, between the center carrier frequency, the input angle modulated wave frequency and the deviated oscillation frequency of the voltage controlled oscillator. Therefore, no noise is generated as has been described above. gain FIG. 6 shows one embodiment of the time constant circuit 44, which comprises resistors R1, R2 and a capacitor C1. In this embodiment, the constants are selected at R1=3.9KΩ, R2=1.8KΩ and C1=33μF. Low frequency components below audio frequency passes through the time constant circuit 44 without attenuation, whereas signal components in the audio frequency band are attenuated by a certain amount by the resistors R1 and R2.

Since a very low frequency below audio frequency which is proximate to DC is hardly attenuated in the time constant circuit 44, the lock range becomes a wide one, as shown between the broken lines A, A' in FIG. 5. This is almost identical with the characteristic shown in FIG. 3. On the other hand, the capacitor C1 becomes short-circuited relative to audio frequency. Consequently, the audio signal level is divided by the resistors R1 and R2 and thereby is attenuated by 0.316 times, i.e. 10dB in the present embodiment. When the loop again has decreased by 10dB, the lock range is between chain lines B, B' in FIG. 5. Accordingly, in the portion where the input signal level is low, the curves shift by 10dB to the portion where the input level is high. In the portion where the input signal level is high, the maximum width of the lock range is narrower by 10dB.

As described in the foregoing, the PLL 40 has two different lock ranges, i.e. one for a very low frequency proximate to DC and the other for the audio signal frequency due to provision of the time constant circuit 44.

Accordingly, in the demodulation of a multi-channel disc, the angle modulated wave difference signal may decrease and disappear. In the above described first embodiment, the PLL does not comprise the time constant circuit 44, but utilizes the lock range portion corresponding to the input signal level of −50dB to −70dB as shown by the shaded portion in FIG. 3 (30KHz ± 6KHz to 30KHz ± 600Hz). If the same lock range portion (30KHz ± 6KHz to 30KHz ± 600Hz) in the range between the curves B, B' is used in the PLL 40 of the present embodiment, which comprises the time constant circuit 44, the input signal level corresponding to this lock range portion is −40dB to −60dB. Consequently, according to the PLL 40 comprising the time constant circuit 44, the input signal level can be about 10dB higher than in the PLL of the first embodiment wherein the PLL does not comprise the time constant circuit 44, if the same lock range portion is used.

The lock range shown between the curves A, A' at a point corresponding to an input signal level of −40dB is a large value of 30KHz ± 16KHz and at a point corresponding to −60dB, 30KHz ± 2KHz. Accordingly, the PLL can operate in a normal manner even if there is a difference of about ±1.5KHz between the center carrier frequency of the input angle modulated wave signal frequency and the very gradually deviated oscillation frequency of the voltage controlled oscillator 45.

Further explanation will be made about selection of the time constant of the time constant circuit 44. When the sound groove of the record disc has been badly worn and the carrier disappears to a considerable extent, the PLL 40 operates in the same manner as in the case wherein the angle modulated wave has been deviated to lower frequencies. This is equivalent to a deviation of the oscillation frequency of the voltage controlled oscillator to the lower frequencies. As a result, noise is generated. Restriction of the noise to a minimum value can be achieved by selecting the time constant of the time constant circuit 44 at a very large value. If, however, the time constant is selected at a very large value, the voltage controlled oscillator 45 will need a long period of time before its oscillation frequency is drawn into the input signal frequency, and noise will be generated during this period. The PLL of the present embodiment operates in a stable manner with regard to the disappearance of the carrier when a response frequency is selected at several Hz, and the drawing time will be so short that it will not cause an accoustic problem. Thus, the embodiment can achieve a very good result.

As described above, in the PLL 40 of the second embodiment having the lock ranges shown in FIG. 5, the voltage controlled oscillator 45 oscillates following the input signal frequency to the phase comparator 41 when the input angle modulated wave signal is a signal having a normal input level with a frequency deviation within the lock range. In case the level of the input angle modulated wave signal has decreased to a large extent for the above stated reason, the voltage controlled oscillator 45 oscillates at the frequency of 30KHz, although the PLL 40 may become unlocked as in the previously described embodiment. Accordingly, even if the level of the input angle modulated wave abruptly decreases or disappears, the carrier is reinforced in this portion by the oscillation signal of the voltage controlled oscillator 45 and no abnormal noise is generated. Besides, the PLL 40 can be used with a relatively large input level since the lock range is the range shown by the curves B, B' for audio frequencies. The adjustment of the input level is made in the level adjusting circuit provided in the former stage of the PLL 40. Furthermore, even if the carrier frequency of the input angle modulated wave is different from the oscillation frequency 30KHz of the voltage controlled oscillator 45, due to deviations from the normal speed of rotation of the turntable and a drift of oscillation frequency (30KHz) of the voltage controlled oscillator 45, the PLL 40 remains in a locked state because the width of the lock range is the wide range shown by the curves A, A', for the very gradual deviations in the oscillation frequency of the voltage controlled oscillator, which deviations have low frequencies below the audio frequencies, and therefore no noise is generated.

Next will be described the third embodiment of the system which is capable of achieving the same purpose as in the second embodiment without using the above described time constant circuit.

The block diagram of the PLL in this third embodiment is identical with the PLL 19 shown in FIG. 1 or the PLL 40 shown in FIG. 4 without the time constant circuit 44, so that illustration thereof is omitted.

Figure 7:
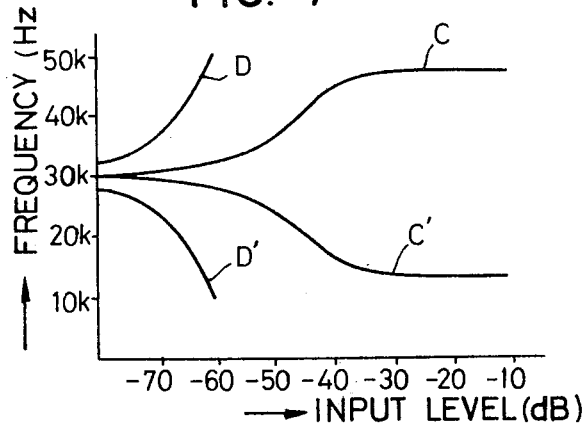
FIG. 7 is a diagram showing the lock frequency range of the phase locked loop according the third embodiment of the invention.

In this embodiment, the loop gain of the PLL is varied by changing the conversion efficiency of the voltage controlled oscillator in accordance with frequencies. By this arrangement, lock ranges have two areas shown in FIG. 7. In FIG. 7, a lock range shown between curves C, C' is relative to the audio signal frequency which is substantially the same as the lock range shown in the system of the first embodiment. A lock range shown between curves D, D' has a very wide lock range and is relative to a DC-like, very low frequency variation which is below the audio frequencies. The lock range between C, C' and between D, D' correspond in their operations to the lock ranges between B, B' and between A, A' in the second embodiment.

Figure 8:
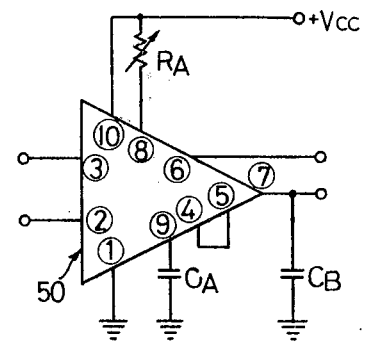
FIG. 8 is a circuit diagram of one embodiment of outside connections of an IC phase locked loop circuit.
Figure 10:
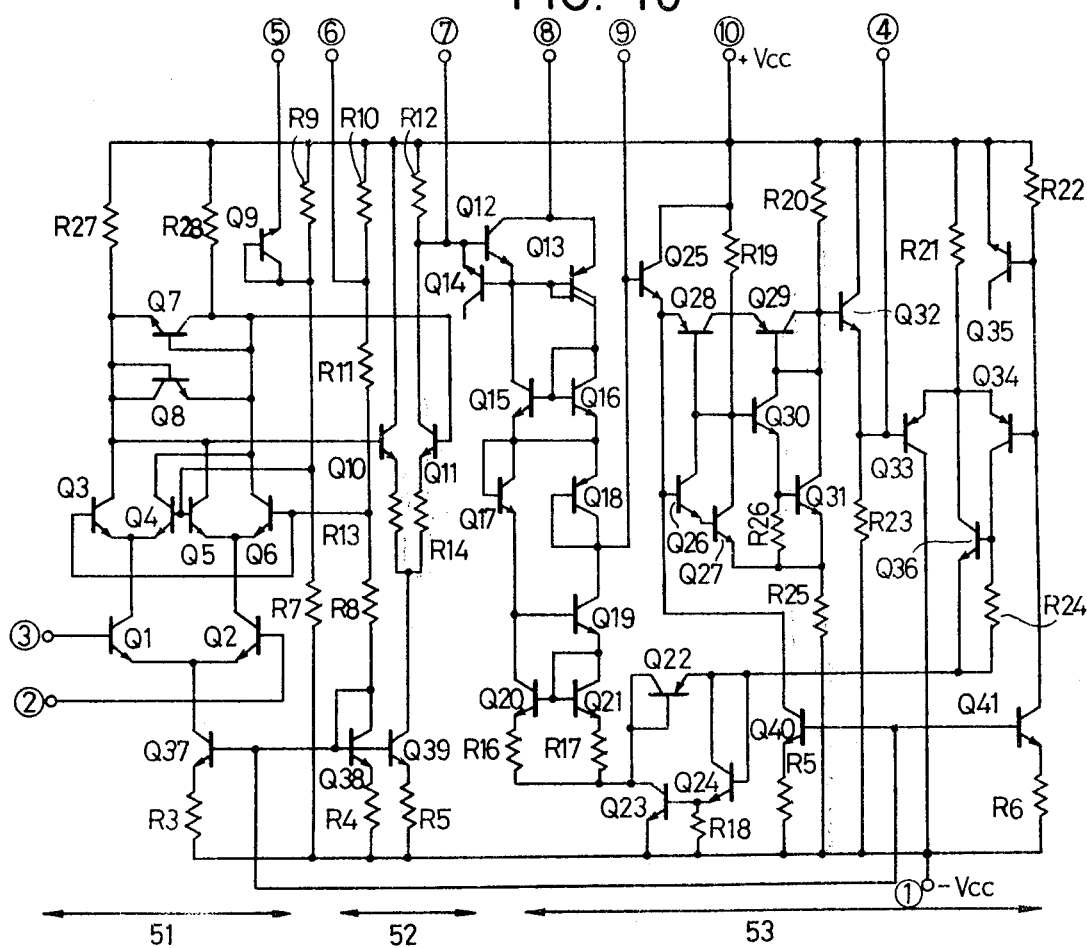
FIG. 10 is a diagram showing an equivalent circuit of one example of an IC phase locked loop circuit.

A concrete circuit for obtaining the lock ranges shown in FIG. 7 will be described. FIG. 8 shows outside connections of an IC circuit of the PLL which is capable of carrying out the system according to this embodiment. An IC circuit 50 is a PLL circuit having a circuit construction shown in FIG. 10. In FIG. 10, a circuit portion 51 shown by arrows constitutes a phase comparator, a circuit portion 52 constitutes an amplifier and a circuit portion 53 constitutes a voltage controlled oscillator.

In FIG. 8, the IC PLL circuit 50 has an earth terminal 1, input terminals 2 and 3, terminals 4 and 5 for connecting the voltage controlled oscillator to the phase comparator, a terminal 6 for comparing the DC component of the output signal, an output terminal 7 for FM demodulation, a terminals 8 and 9 for connecting elements for determining the oscillation frequency of the voltage controlled oscillator and a power source terminal 10. The terminal 8 is connected to the power source +Vcc through a variable resistor $R_A$ and the terminal 9 is grounded through a capacitor $C_A$. The oscillation frequency 30KHz of the voltage controlled oscillator in the unlocked state is determined by an adjustment of the variable resistor $R_A$ and by the capacitor $C_A$. The terminal 7 is grounded through the capacitor $C_B$ for passing a low frequency band. When the angle modulated wave is applied to the terminals 2 and 3 in the circuit of the above described construction, the demodulated signal of the angle modulated wave is obtained from the terminal 7.

Figure 9A:
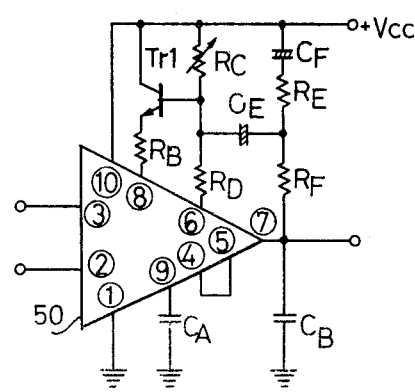
FIGS. 9A and 9B are respectively circuit diagrams of circuits which are capable of carrying out a third embodiment of the system according to the invention.

FIG. 9A shows a first example of a circuit using the IC circuit shown in FIG. 8, which is capable of carrying out the third embodiment of the system according to the invention. In FIG. 9A, the components which are the same as those shown in FIG. 8 are designated by the same reference numerals. The emitter of a transistor $Tr_1$ is connected through a resistor $R_B$ to a terminal 8 of an IC circuit 50. The collector of the transistor $Tr_1$ is connected to a power source +Vcc. A variable resistor $R_C$ and a fixed resistor $R_D$ are connected in a series circuit extending between a terminal 6 of the IC circuit 50 and the power source +Vcc. The potential at the junction of the resistors $R_C$ and $R_D$ is as bias applied to the base of the transistor $Tr_1$. Further, resistors $R_E$ and $R_F$ and a capacitor $C_F$ are connected in series between the output terminal 7 and the power source +Vcc. The potential at the junction of the resistors $R_E$ and $R_F$ is applied to the base of the transistor $Tr_1$ via a capacitor $C_E$.

The operation of the circuit shown in FIG. 9A will be described hereinbelow. If the circuit of FIG. 9A is viewed in a DC manner, a constant bias divided by the resistors $R_C$ and $R_D$ is applied to the base of the transistor $Tr_1$. The resistors $R_E$ and $R_F$ do not affect the bias to the transistor $Tr_1$ because the capacitor $C_F$ has an infinite impedance in a DC sense. When this constant voltage is applied to the base of the transistor $Tr_1$, a current of a predetermined value flows between the emitter and collector of the transistor $Tr_1$. A voltage (which is lower than the power source +Vcc by the voltage drop across the transistor $Tr_1$) is applied to the resistor $R_B$. This is equivalent to the state in which the resistor $R_B$ is connected to a power source which is of a constant voltage lower than the power source +Vcc.

As will be apparent from the internal connections of the IC circuit 50, the terminals 7 and 8 are maintained at substantially the same potential. In FIG. 10, the base of a transistor Q13 is connected in emitter follower connection to a transistor Q12, and the terminal 8 is connected in emitter follower connection to the transistor Q13. Since a transistor in emitter follower connection has a gain of unity as is well known, the terminals 7 and 8 are at the same potential.

Accordingly, if the demodulated wave output, i.e. the output voltage at the terminal 7 changes, the voltage at the terminal 8 also changes. This changes the voltage across the resistor $R_B$ connected to the terminal 8, thereby changing the current flowing through the resistor $R_B$. As a result, the charging and discharging currents applied to the timing capacitor $C_A$ of the voltage controlled oscillator change the oscillation frequency of the voltage controlled oscillator.

Since a constant voltage is applied to the base of the transistor $Tr_1$ (as described above) and the impedance of its emitter circuit is low, there is a large variation in the value of the current flowing at the terminal 8 relative to the small variation in the voltage at the terminal 7. Accordingly, there is a large conversion efficiency, i.e. the deviation in the oscillation frequency of the voltage controlled oscillator is large relative to a unit voltage variation at the terminal 7 is large.

If the circuit shown in FIG. 9A is considered in an AC sense, the voltage variation at the terminal 7 is divided at a constant ratio by the resistors $R_E$ and $R_F$ and thereafter is applied through capacitor $C_E$ to the base of the transistor $Tr_1$. Since this dividing ratio is somewhat affected by the resistors $R_C$ and $R_D$ and an input impedance viewed from the base of the transistor $Tr_1$, the values of the resistors $R_E$ and $R_F$ are determined so that the predetermined dividing ratio may be selected in consideration of the factors described above. In the present embodiment, the values of the resistors $R_E$ and $R_D$ are selected at a smaller value than the value of a resistor R12 (3.6 K$\Omega$) of the IC circuit 50. Since the resistor $R_B$ is connected to the emitter of the transistor $Tr_1$ and the transistor $Tr_1$ is connected in an emitter follower configuration, the emitter voltage of the transistor $Tr_1$, (i.e. the voltage at the upper terminal of the resistor $R_B$ as viewed in the figure) are varied as the voltage at its base is varied as described above.

On the other hand, the voltage variation at the terminal 7 causes the voltage variation at the terminal 8, i.e. the terminal below the resistor $R_B$. Therefore, the voltage across the resistor $R_B$ do not change very much. Actually, the voltage across the resistor $R_B$ changes by only a fraction of the voltage variation at the terminal 7. Accordingly, the variation in the current flowing through the resistor $R_B$ is also small. As a result, the deviation in the oscillation frequency of the voltage controlled oscillator is small and, therefore, the conversion frequency of the voltage controlled oscillator is small in an AC sense.

It will be understood from the foregoing description that the resistor $R_B$ has a value of resistance which is only a fraction of the value of the resistor $R_A$ shown in FIG. 8 in a DC sense and which is equal to that of the resistor $R_A$ in an AC sense. Accordingly, the circuit of the embodiment shown in FIG. 9A has the lock ranges shown in FIG. 7. This lock range is similar to that of the PLL in the first embodiment relative to the audio signal frequency. It is a lock range, the width of which is several times larger than that of the lock range taken relative to a somewhat DC-like, very low frequency.

Figure 9B:
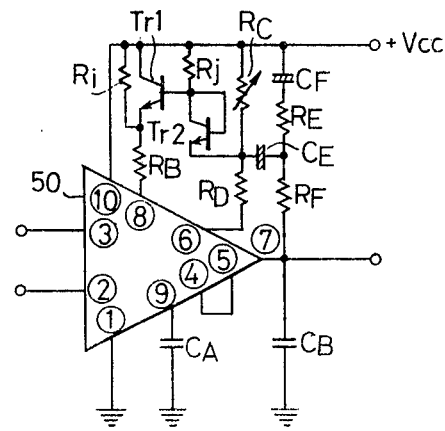

FIG. 9B is the circuit diagram of the second example of the circuit which is capable of carrying out the third embodiment of the system according to the invention. The collector and the base of a transistor $Tr_2$ are short-circuited. The emitter of the transistor $Tr_2$ is connected to a junction point between a variable resistor $R_C$ and a resistor $R_D$. The collector thereof is connected to the base of a transistor $Tr_1$. The base of the transistor $Tr_1$ is connected to a power source +Vcc via a resistor $R_j$. The emitter of the transistor $Tr_1$ is connected to the power source +Vcc through a resistor $R_i$. In other respects, the circuit has the same construction as the one shown in FIG. 9A. In this construction, the transistor $Tr_2$ operates as a diode because its base and collector are short-circuited. The characteristic of the P-N junction of the diode relative to temperature change is nearly the same as the base-emitter temperature characteristic of the transistor $Tr_1$. Therefore, temperature compensation of the transistor $Tr_1$ can be made by connecting the transistor $Tr_2$. The resistor $R_i$ supplies current to the terminal 8 even when the transistor $Tr_1$ is in a cutoff state, thereby stabilizing the circuit.

In the circuits shown in FIGS. 9A and 9B, the conversion efficiency of the voltage controlled oscillator is varied relative to a DC-like signal component. It is obvious, however, that a similar effect can be obtained by setting a DC gain of either one of other circuit components in the PLL, i.e. the phase comparator or the amplifier, at a large value.

Figure 11:
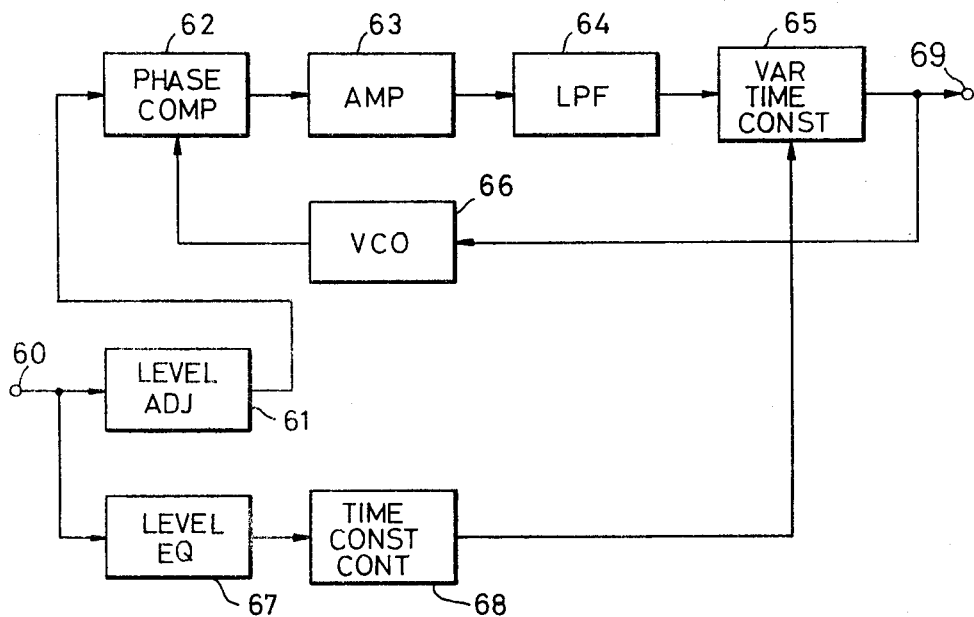
FIG. 11 is a block diagram showing a phase locked loop which is capable of carrying out a fourth embodiment of the system according to the invention.

FIG. 11 is the block diagram of the PLL system which is capable of carrying out the fourth embodiment of the system according to the invention. The angle modulated wave which has passed through the band-pass filter (designated by reference numeral 17 in FIG. 1) is applied to an input terminal 60. This angle modulated wave is supplied to a level adjusting circuit 61. The angle modulated wave is thereafter is supplied to a phase comparator 62 in which it is compared with an output oscillation frequency of a voltage controlled oscillator 66. The error output of the phase comparator 62 is supplied through an amplifier 63 and a low-pass filter 64 to a variable time constant circuit 65.

The angle modulated wave signal from the terminal 60 is also supplied to a level equalizing circuit 67. The level equalizing circuit 67 adjusts the level of the signal to a standardized level so that a reproduced level does not differ one from the other depending upon the type of a pick-up cartridge used for the reproduction, under the condition that the pick-up stylus is tracing the sound groove in a normal manner. A time constant control circuit 68 operates in response to the level of the signal supplied from the level equalizing circuit 67 and controls the time constant of the variable time constant circuit 65 by its output control voltage.

Figure 13:
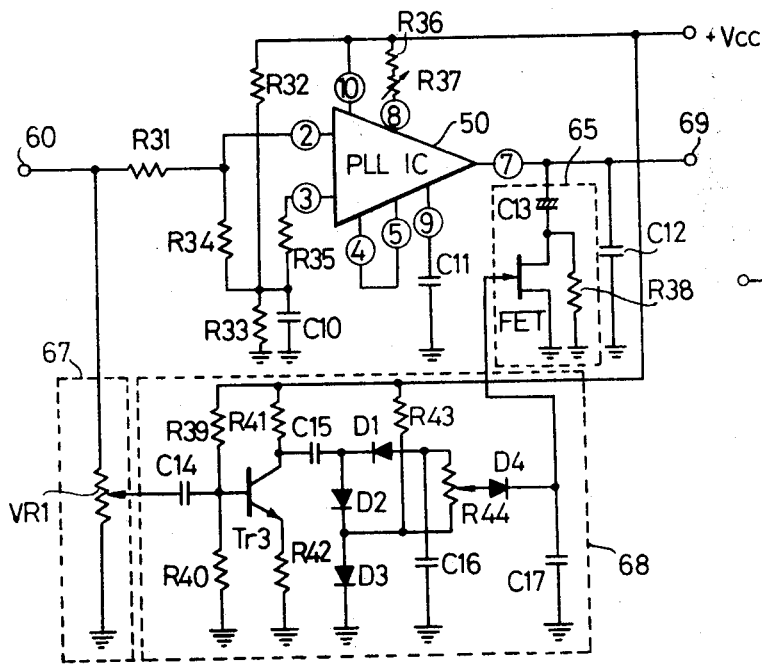
FIG. 13 is a circuit diagram of a main part of the block diagram shown in FIG. 11.

FIG. 13 shows one concrete embodiment of the essential part of the block system shown in FIG. 11. The input angle modulated wave signal applied to a terminal 60 is supplied to an input terminal 2 of an IC PLL circuit 50 via a resistor R31 and also to an input terminal 3 via resistors R34 and R35. These resistors R31 and R34 constitute a dividing circuit provided for level adjusting. Voltage is applied from the power source +Vcc to resistors R32 and R33 to provide a suitable bias to the above described dividing circuit.

Figure 14:
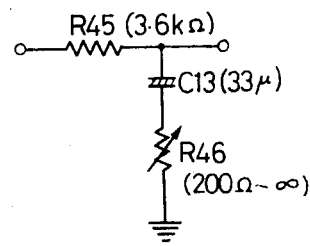
FIG. 14 is a diagram showing an equivalent circuit of the variable time constant circuit included in the block diagram shown in FIG. 11.
Figure 16:
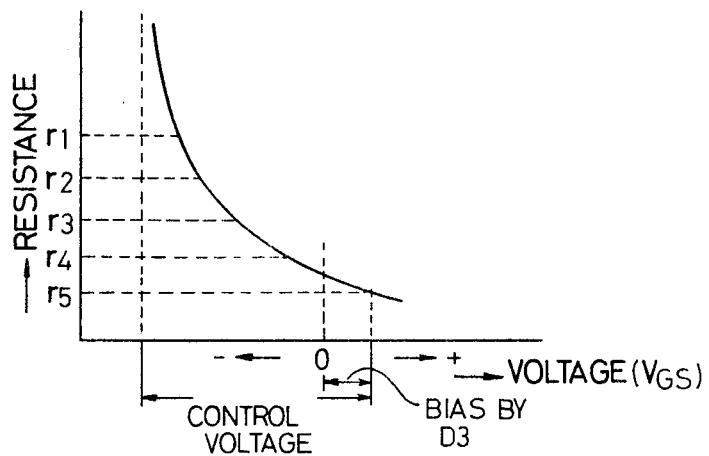
FIG. 16 is a diagram showing the characteristic of a field-effect transistor.
Figure 17:
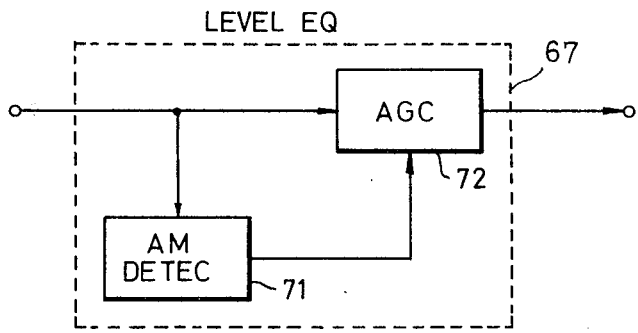
FIG. 17 is a block diagram showing a level equalizing circuit included in the block diagram shown in FIG. 11.

The output signal from a terminal 7 of the IC circuit 50 is applied to the variable time constant circuit 65, enclosed by a broken line. The variable time constant circuit 65 comprises a capacitor C13, resistors R38 and R45 (provided in the IC circuit 50 as illustrated in FIG. 14) and a field effect transistor FET. The field effect transistor FET is used as a variable resistor with the value of resistance $R_{DS}$ between its source and drain being varied as shown in FIG. 16 in response to voltage $V_{GS}$ which is applied to its gate. An equivalent circuit of the time constant circuit 65 is shown in FIG. 14. In FIG. 14, a variable resistor R46 is a resistor which represents the combines resistances of the field effect transistor FET and the resistor R38.

The time constant of the variable time constant circuit 65 is controlled by the output control voltage of the time constant control circuit 68. A part of the angle modulated wave signal applied to the input terminal 60 is supplied through the level equalizing circuit 67 consisting of a variable resistor VR1 connected to the time constant circuit 68.

The signal is first supplied to a transistor $Tr_3$ through a coupling capacitor C14. The signal which has been amplified by this transistor $Tr_3$ is then rectified by a circuit comprising a capacitor C15, diodes D1 and D2 and a capacitor C16. The rectified negative voltage is applied to the gate of field effect transistor FET through a variable resistor 44 and a diode D4. The value of the resistance of the field effect transistor FET is adjusted by adjusting the value of the variable resistor R44. A resistor R43 and a diode D3 are provided for supplying a positive bias to the field effect transistor FET. The value of resistance of the field effect transistor FET (2SK30) is about 400Ω at a bias of OV.

When the input of the PLL is small, the above described positive bias is applied so as to decrease the loop gain for more effectively coping with the abnormal input. At this time, the field effect transistor FET has a resistance value in the order of 200Ω. A diode D4 and a capacitor C17 constitute a circuit for adjusting the rising and falling times of the control voltage. When the input is abnormal, the circuit decreases the value of resistance of the field effect transistor FET by a short rising time, thereby decreasing the loop gain. When the input returns to a normal state, the circuit increases the value of resistance of the field effect transistor FET by a long falling time. This arrangement prevents an occurence of unnaturalness in the demodulated audio signal even when an abnormal input is repeatedly applied with a violent fluctuation in the level.

Figure 15:
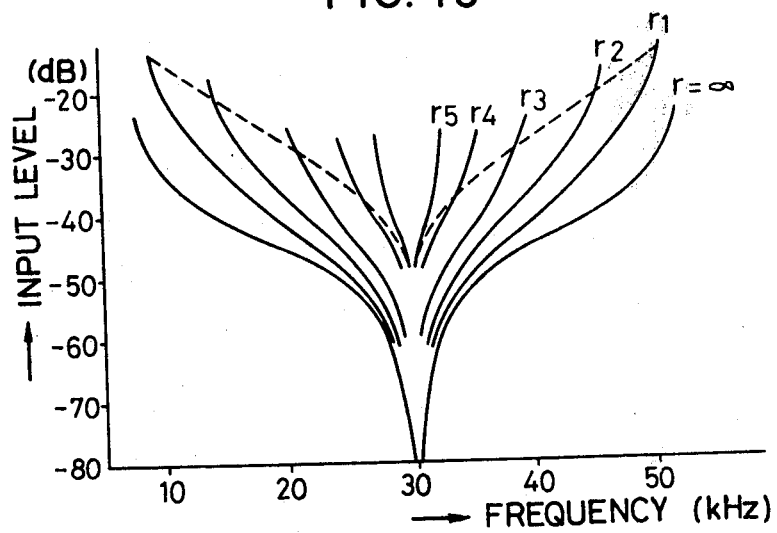
FIG. 15 is a diagram showing the lock frquency range used for illustrating the operation of the block diagram shown in FIG. 11.

This operation of the above described circuit will be described more in detail. During a normal tracing state of the pick-up, input angle modulated wave applied to the input terminal 60 is adjusted to a necessary level by the time constant control circuit 68 acting responsive to the level equalizing circuit 67. When the level of the input angle modulated wave is deviated from this state, a bias voltage in the negative direction is applied to the field effect transistor FET. This bias voltage is greater if the input level is higher (i.e. in a normal condition). This field effect transistor FET has, as shown in FIG. 16, a large value of resistance when the voltage applied to the gate is large in the negative direction and a small value of resistance when this voltage is small. As the value of the resistance of this field effect transistor FET changes, the loop gain of the PLL also changes. Accordingly, the lock range frequency characteristic of the PLL also changes in an AC sense. When the value of resistance $R_{DS}$ between the source and the drain of the field effect transistor FET changes from $\infty \sim r_1 \sim r_5 \sim 0$ as shown in FIG. 16, the lock range frequency characteristics in an AC sense are as shown in FIG. 15. Accordingly, if the value of resistance changes continuously, a lock range in an AC sense is obtained as shown by a broken line in FIG. 15.

Let it be assumed that the constant of the level equalizing circuit 67 and the value of the resistance of the field effect transistor FET are selected so that the PLL has a lock range of 30KHz ± 6KHz in an AC sense. This range maintains a high fidelity when the level of the input angle modulated wave is −50dB in the normal tracing state of the pick-up. If the input level is an abnormal input which is smaller than the above described level, the value of the resistance of the field effect transistor FET becomes smaller than the above stated value, thereby decreasing the loop gain of the PLL. As a result, deterioration of sound quality can be effectively prevented. On the contrary, if the input level is greater, the value of resistance of the field effect transistor FET increases, thereby widening the lock range to maintain high fidelity. Further, when the output level (i.e. the input angle modulated wave in the normal tracing state) changes due to replacement of the pick-up cartridge, readjustment in the level equalizing circuit 67 is possible regardless of the input level. The value of the resistance of the field effect transistor FET can be maintained at the normal value prior to the replacement of the pick-up cartridge.

Figure 12:
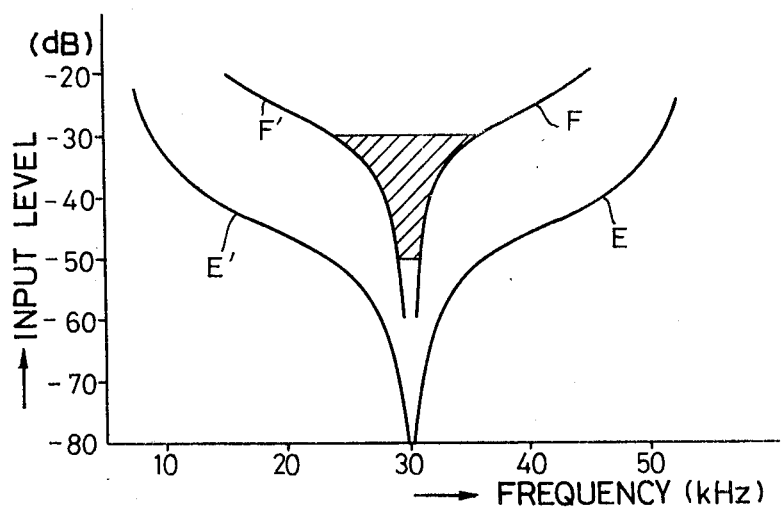
FIG. 12 is a diagram showing the lock frequency range of the phase locked loop shown in FIG. 11.

In FIG. 12 an area between curves E, E' is a lock frequency range in a DC sense (i.e. low frequencies below the audio frequencies) and an area between curves F, F' is a lock frequency range in an AC sense (i.e. the audio frequencies) of system constructed according to the present embodiment and constructed in the above described manner. As will be apparent from this FIG. 12, the lock range in the AC sense is obtained with a difference of 20dB from the lock range in the DC sense. This means an improvement of 10dB as compared with the lock ranges of the second embodiment shown in FIG. 5 and an improvement of 20dB as compared with the first embodiment, which has no time constant circuit.

The level equalizing circuit 67 is provided, as described above, for standardizing the output level which varies depending upon the type of a pick-up cartridge used for reproduction and operating only at a drop in the input level which is abnormal as a loop gain control signal, thereby decreasing its gain. Accordingly, is is necessary for the level equalizing circuit 67 to set the level to a state immediately before the loop gain starts to decrease relative to the initial output level of each pick-up cartridge. There are three methods to effect this setting as will be described hereinbelow.

The first method is to detect a drop in the reproduced level in high frequencies due to a decrease in the loop gain by measuring frequency characteristic. The adjustment of the level of the input angle modulated wave in a state immediately before the loop gain starts to decrease coincides with the adjustment of the level in a state immediately before the frequency characteristic starts to decrease. Accordingly, the measurement is made for each initial input for standardizing the level.

The second method is to detect a point at which the reproduced demodulated waveform starts to be deformed by the input angle modulated wave by utilizing the fact that the lock range in an AC sense decreases when the loop gain starts to decrease. In this case, the detection can be made accurately and clearly by modulating a signal having a low frequency of several hundred Hz at a large modulation degree. Since the lock range in an AC sense differs depending upon the frequency of the modulated wave and the modulation degree, the relation between the point at which the loop gain starts to decrease and the point at which the reproduced signal starts to be deformed should previously be found out. Actual examples show that the reproduced waveform starts to be deformed at a point which is −2dB lower than the point at which the loop gain starts to decrease in a signal of 100Hz with 10KHz deviation, and −4dB lower in a signal of 400Hz with 4KHz deviation. Accordingly, the input angle modulated waves may be reinforced by these amounts.

According to this method, an accurate level equalizing can be made without using any special measuring instrument. For example, when a multi-channel record disc is played back with a signal of 400Hz having a deviation of 4KHz cut at a level which is lower than the reference carrier level by −4dB, the variable resistor $VR_1$ of the level equalizing circuit is set by means of a screw driver or the like to hold a level immediately before the point at which the signal starts to be distorted (where a higher harmonics noise is clearly audible). The variable resistor VR₁ should preferably be provided outside of the reproduction apparatus.

The third method is to detect an abnormal state of the angle modulated wave by detecting both the level of the input angle modulated wave and the AM component due to the change in the level. This method can be realized by a level equalizing circuit 67 with an AM component detection circuit 71 and an AGC circuit 72. The detection output of the AM component detection circuit 71 controls the AGC circuit 72. According to this method, the standardization of the level necessitated by the variation in the output of pick-up cartridges can automatically be made.

In each of the foregoing embodiment, description has been made as to a case in which the system according to the invention has been applied to the multi-channel record disc reproduction apparatus. However, the system according to the invention may be applied to a demodulation of the angle modulated wave reproduced from a magnetic tape of a tape recorder. In this case, no noise will be generated even if there is a dropout in the reproduced signal from the magnetic tape.

Further, this invention is not limited to these embodiments but various variations and modifications may be made without departing from the scope and spirit of the invention.

What we claim is:

1. A system for demodulating an angle modulated wave which is picked up from a recording medium on which is recorded an audio signal which is angle modulated on a carrier wave, said system comprising:

a phase locked loop system including voltage controlled oscillator means; phase comparator means for comparing the phase of a carrier wave of the picked-up angle modulated wave with the phase of an oscillation signal generated by said voltage controlled oscillator means and for generating an output signal corresponding to the phase difference; time constant circuit means responsive to the phase comparator means output signal for attenuating audio frequency components more than frequency components which are lower than the audio frequency components, the audio frequency components and the frequency components being lower than the audio frequency components appearing in the output signal of said phase comparator means, the output signal of said time constant circuit means providing a demodulation of the picked-up angle modulated wave, means responsive to a feed back from the output of said time constant circuit means to said voltage controlled oscillator means to cause the oscillator output to follow the frequency of the carrier wave of the picked-up angle modulated wave, means whereby said phase locked loop system has first and second lock frequency ranges falling within the oscillation frequency of said voltage controlled oscillator means and controlled responsive to the output of said time constant means, said second lock frequency range being more narrow than the first lock frequency range, means responsive to the lower than audio frequency components for establishing said first lock frequency range and causing said voltage controlled oscillator means to follow any deviations between the frequency of the picked-up carrier wave and the frequency which the carrier wave had when it was originally recorded, and means responsive to the audio frequency components for establishing said second lock frequency range and causing said voltage controlled oscillator means to follow any audio frequency deviations of the picked-up carrier wave;

means responsive to the frequency of the carrier wave of the picked-up angle modulated wave which lies outside of said first lock frequency range for operating said voltage controlled oscillator means to oscillate at a frequency which is substantially equal to the frequency which the carrier wave had when the carrier wave was recorded on the recording medium; and means responsive to the level of the picked-up carrier wave exceeding the frequency width where said second lock frequency range begins to saturate for adjusting the level of the picked-up carrier wave to be below a predetermined level, and means for applying the output of said level adjusting means to said phase comparator means.

2. An angle modulated wave demodulation system as defined in claim 1 wherein said time constant circuit means comprises a series circuit of a first resistor, a capacitor and a second resistor, means for applying the output signal of said phase comparator means across said series circuit, and means for applying a signal derived from a junction of the first resistor and the capacitor as a control signal to said voltage controlled oscillator means.

3. An angle modulated wave demodulation system as defined in claim 2 wherein said second resistor is a variable resistance element, said system further comprising time constant control circuit means responsive to the carrier wave of the angle modulated wave signal for producing a second control signal in accordance with the level of the carrier wave, means for applying said second control signal to the variable resistance element so that the resistance of the variable resistance element decreases as the level of the carrier wave decreases, whereby the width of the second lock frequency range becomes narrower as the level of the carrier wave decreases.

4. An angle modulated wave demodulation system as defined in claim 3 further comprising level equalizing circuit means responsive to the carrier wave of the angle modulated wave signal for adjusting the level of the carrier wave to be a standard level and for supplying the carrier wave as adjusted in level to said time constant control circuit means.

* * * * *